(12) United States Patent
Buettgen et al.

(10) Patent No.: US 10,861,889 B2
(45) Date of Patent: Dec. 8, 2020

(54) SEMICONDUCTOR DEVICES

(71) Applicant: ams Sensors Singapore Pte. Ltd., Singapore (SG)

(72) Inventors: Bernhard Buettgen, Adliswil (CH); Gözen Köklü, Zurich (CH); Theodor Walter Loeliger, Uster (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/069,986

(22) PCT Filed: Jan. 16, 2017

(86) PCT No.: PCT/SG2017/050019
§ 371 (c)(1),
(2) Date: Jul. 13, 2018

(87) PCT Pub. No.: WO2017/123159
PCT Pub. Date: Jul. 20, 2017

(65) Prior Publication Data
US 2019/0027516 A1    Jan. 24, 2019

Related U.S. Application Data

(60) Provisional application No. 62/279,076, filed on Jan. 15, 2016.

(51) Int. Cl.
*H01L 27/146* (2006.01)
*H01L 31/101* (2006.01)
*H01L 21/266* (2006.01)

(52) U.S. Cl.
CPC .... *H01L 27/1461* (2013.01); *H01L 27/14603* (2013.01); *H01L 27/14612* (2013.01);
(Continued)

(58) Field of Classification Search
CPC ......... H01L 27/14603–14607; H01L 27/1461; H01L 27/14612; H01L 27/14616;
(Continued)

(56) References Cited

U.S. PATENT DOCUMENTS 6,051,447 A    4/2000  Lee et al.
7,586,077 B2   9/2009  Lehmann et al.
(Continued)

FOREIGN PATENT DOCUMENTS

EP    2348537       7/2011
TW    201010069 A   3/2010

OTHER PUBLICATIONS

ISA/AU, International Search Report for PCT/SG2017/050019 (dated Mar. 1, 2017).
(Continued)

*Primary Examiner* — Yu Chen
(74) *Attorney, Agent, or Firm* — Michael Best and Friedrich LLP

(57) ABSTRACT

A semiconductor device operable to demodulate incident modulated electromagnetic radiation, the semiconductor device comprising: a pinned photodiode structure including a substrate of a first type, an implant layer of a second type disposed within the substrate, first and second auxiliary implant layers of the second type disposed within the substrate and each disposed adjacent to the implant layer of the second type, an implant layer of the first type disposed within the implant layer of the second type and extending into the first and second auxiliary implant layers of the second type, an insulator disposed on a surface of the substrate, and a photo-detection region; first and second transfer gates disposed on a surface of the insulator, the transfer gates being operable to generate a field within the substrate; and first and second floating diffusion implant layers of the second type disposed within the substrate.

18 Claims, 3 Drawing Sheets

(52) U.S. Cl.
CPC ...... *H01L 27/14616* (2013.01); *H01L 31/101* (2013.01); *H01L 21/266* (2013.01)

(58) Field of Classification Search
CPC ......... H01L 27/14641; H01L 27/14689; H01L 29/105; G01S 17/10–107; G01S 17/89; G01S 7/4913–4914
See application file for complete search history.

(56) References Cited

U.S. PATENT DOCUMENTS

| | | |
|---|---|---|
| 7,671,671 B2 | 3/2010 | Buettgen et al. |
| 7,884,310 B2 | 2/2011 | Buettgen |
| 8,760,549 B2 | 6/2014 | Lehmann et al. |
| 9,117,712 B1 | 8/2015 | Oggier et al. |
| 2006/0146158 A1 | 7/2006 | Toros et al. |
| 2009/0224139 A1 | 9/2009 | Buettgen et al. |
| 2011/0198481 A1 | 8/2011 | Kim et al. |
| 2012/0002089 A1 | 1/2012 | Wang et al. |
| 2015/0008493 A1* | 1/2015 | Ni ............... H01L 27/14616 257/292 |
| 2015/0021461 A1* | 1/2015 | Nishihara ......... H01L 27/14609 250/208.1 |
| 2016/0013240 A1* | 1/2016 | Jung ............... H01L 27/14645 257/292 |
| 2017/0192090 A1* | 7/2017 | Roy ..................... G01S 7/4914 |

OTHER PUBLICATIONS

English Translation of Office Action issued from the Taiwan Patent Office for related Application No. TW106101281 (7 pages).

\* cited by examiner

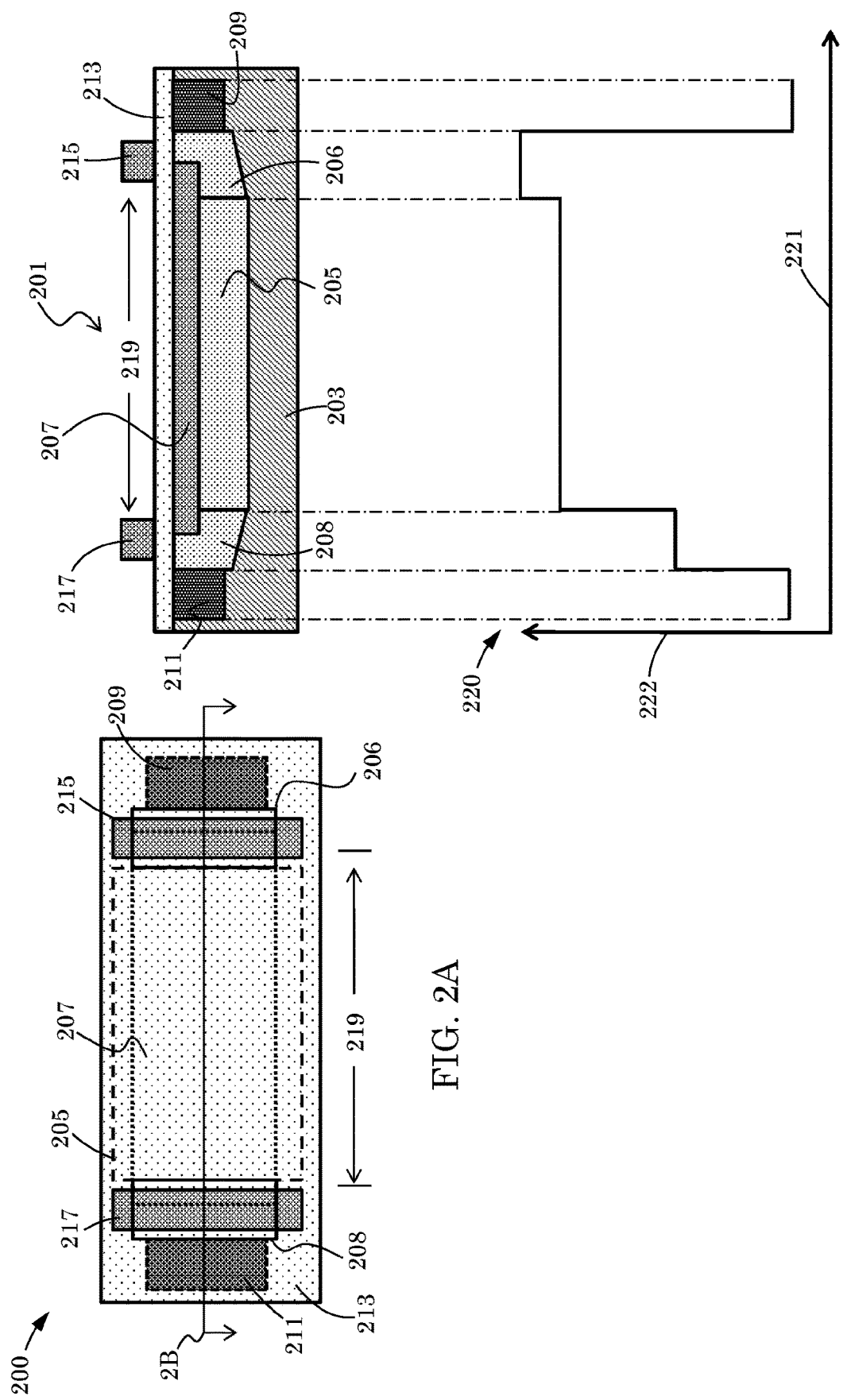

SEMICONDUCTOR DEVICES

BACKGROUND

Semiconductor materials may be doped via ion implantation: a process by which ions are accelerated with an electrical field and impacted into another material. The concentration and distribution of the ions (i.e., the dopants) in the resultant ion-implanted semiconductor material can strongly influence the effectiveness and efficiency of the semiconductor device into which the semiconductor material is incorporated (e.g., a pixel). In some instances, a mask is employed to direct ions; however, little tolerance in mask position is permitted. In some cases, a slight misalignment of the mask can lead to poor semiconductor device performance. Misalignment, for example, can lead to potential barriers or potential bumps within the semiconductor device resulting in non-ideal charge-carrier transport and poor device performance.

SUMMARY

This disclosure describes semiconductor devices operable to demodulate incident modulated electromagnetic radiation. In some instances, the semiconductor devices can be implemented without generating undesirable potential barriers, and can be insensitive to mask misalignment during ion implantation. In some instances, the semiconductor devices can be implemented such that chare-transfer efficiency between photo-detection regions and transfer gates within the semiconductor devices can be optimized.

In a first aspect, for example, a semiconductor device operable to demodulate incident modulated electromagnetic radiation includes a pinned photodiode structure. The pinned photodiode structure can include a substrate of a first type, and an implant layer of a second type disposed within the substrate of the first type. The pinned photodiode structure can further include a first auxiliary implant layer of the second type disposed adjacent to the implant layer of the second type, and a second auxiliary implant layer of the second type disposed adjacent to the implant layer of the second type. The first and second auxiliary implant layers can be disposed within the substrate. The pinned photodiode structure can further include an implant layer of the first type disposed within the implant layer of the second type. The implant layer of the first type can extend into the first auxiliary implant layer of the second type and the second auxiliary implant layer of a second type. The pinned photodiode structure can further include an insulator disposed on a surface of the substrate, and can further include a photo-detection region. The semiconductor device can further include a first transfer gate and a second transfer gate disposed on a surface of the insulator, the first transfer gates and/or the second transfer gate can be operable to generate a field within the substrate of the first type. The semiconductor device can further include a first floating diffusion implant layer of a second type and a second floating diffusion implant layer of a second type disposed within the substrate of the first type.

In another aspect, for example, a semiconductor device having components of a first and a second type can be operable to generate charge-carriers of the second type from modulated electromagnetic radiation incident on the photo-detection region. The generated charge-carriers can have modulation characteristics of the incident modulated electromagnetic radiation.

In another aspect, for example, a semiconductor device having components of a first and a second type can include a first transfer gate and a second transfer gate operable to conduct alternately charge-carriers corresponding to a first floating diffusion implant layer and to a second floating diffusion implant layer.

In another aspect, for example, a semiconductor device having components of a first and a second type can include a first auxiliary implant layer of the second type extending under a first transfer gate, and a second auxiliary implant layer of the second type extending under a second transfer gate.

In another aspect, for example, a semiconductor device having components of a first and a second type can include a first auxiliary implant layer of the second type abutting a first floating diffusion implant layer of the second type.

In another aspect, for example, a semiconductor device having components of a first and a second type can include a second auxiliary implant layer of the second type abutting a second floating diffusion implant layer of the second type.

In another aspect, for example, a semiconductor device having components of a first and a second type can include first and second auxiliary implant layers of the second type having the same dopant concentration as an implant layer of the second type.

In another aspect, for example, a semiconductor device having components of a first and a second type can include first and second auxiliary implant layers of the second type extending from the implant layer of the second type contiguously.

In another aspect, for example, a semiconductor device having components of a first and a second type can include a pinned photodiode structure with a substrate of the first type, an implant layer of the second type, a first auxiliary implant layer of the second type disposed adjacent to the implant layer of the second type, and a second auxiliary implant layer of the second type disposed adjacent to the implant layer of the second type.

In another aspect, for example, a semiconductor device having components of a first and a second type can include first and second auxiliary implant layers of the second type abutting an implant layer of the second type.

In another aspect, for example, a semiconductor device having components of a first and a second type can include first and second floating diffusion implant layers of the second type. The first floating diffusion implant layer of the second type can abut a first auxiliary implant layer of the second type, and the second floating diffusion implant layer of the second type can abut a second auxiliary implant layer of the second type.

In another aspect, for example, a semiconductor device having components of a first and a second type can include first and second auxiliary implant layers of the second type having the same doping concentration as an implant layer of the second type.

In another aspect, for example, a semiconductor device having components of a first and a second type can include a first auxiliary implant layer of the second type and a second auxiliary implant layer of the second type with a concentration gradient of dopants.

In another aspect, for example, a semiconductor device having components of a first and a second type can include holes as the majority charge-carriers in components of the first type, and electrons as the majority charge-carriers in components of the second type.

In another aspect, for example, a semiconductor device having components of a first and a second type can include electrons as the majority charge-carriers in components of the first type, and holes as the majority charge-carriers in components of the second type.

In another aspect, for example, a semiconductor device having components of a first and a second type can include at least one additional transfer gate disposed on a surface of the insulator. The at least one additional transfer gate can be operable to generate a field within a substrate of the first type.

In another aspect, for example, a semiconductor device having components of a first and a second type can include at least one additional floating diffusion implant layer of the second type disposed within a substrate of the first type and at least one additional auxiliary implant layer of the second type disposed adjacent to an implant layer of the second type.

In another aspect, for example, a semiconductor device having components of a first and a second type can be operable to generate charge-carriers of the second type from modulated electromagnetic radiation incident on a photo-detection region, wherein the generated charge-carriers have modulation characteristics of the incident modulated electromagnetic radiation.

In another aspect, for example, a semiconductor device having components of a first and a second type can include a first transfer gate, a second transfer gate, and an at least one addition transfer gate. The first transfer gate, the second transfer gate, and the at least one additional transfer gate ca be operable to conduct alternately charge-carriers to a first floating diffusion implant layer, to a second floating diffusion implant layer, and to an at least one additional floating diffusion implant layer.

In another aspect, for example, a semiconductor device having components of a first and a second type can include at least one dump gate disposed on a surface of an insulator, the at least one dump gate being operable to generate a field within a substrate of the first type. The semiconductor device can further include at least one dump floating diffusion implant layer of the second type disposed within the substrate of the first type, and at least one additional dump auxiliary implant layer of the second type disposed adjacent to an implant layer of the second type.

In another aspect, for example, a semiconductor device having components of a first and a second type can include a first transfer gate, a second transfer gate, and a dump gate. The first transfer gate, the second transfer gate, and the dump gate can be operable to conduct charge-carriers to an at least one dump floating diffusion layer.

In another aspect, for example, a semiconductor device having components of a first and a second type can include a first transfer gate, a second transfer gate, and a dump gate. The first transfer gate, second transfer gate and dump gate can be operable to conduct alternately charge-carriers to a first floating diffusion implant layer, to a second floating diffusion implant layer, and to a dump floating diffusion implant layer.

In another aspect, for example, a semiconductor device having components of a first and a second type can include a first auxiliary implant layer of the second type extending under a first transfer gate, a second auxiliary implant layer of the second type extending under a second transfer gate, a dump auxiliary implant layer of the second type extending under a dump gate, and the first auxiliary implant layer, the second auxiliary implant layer, and the dump auxiliary implant layer each having a concentration gradient of dopants.

Other aspects, features, and advantages will be apparent from the following detailed description, the accompanying drawings, and the claims

BRIEF DESCRIPTION OF THE DRAWINGS

FIG. 2A depicts a schematic top view of another example semiconductor device.

FIG. 2B depicts a schematic cross-sectional view and a potential distribution spanning a lateral dimension of the example semiconductor device depicted in FIG. 2A

DETAILED DESCRIPTION

Figures 1A, 1B:
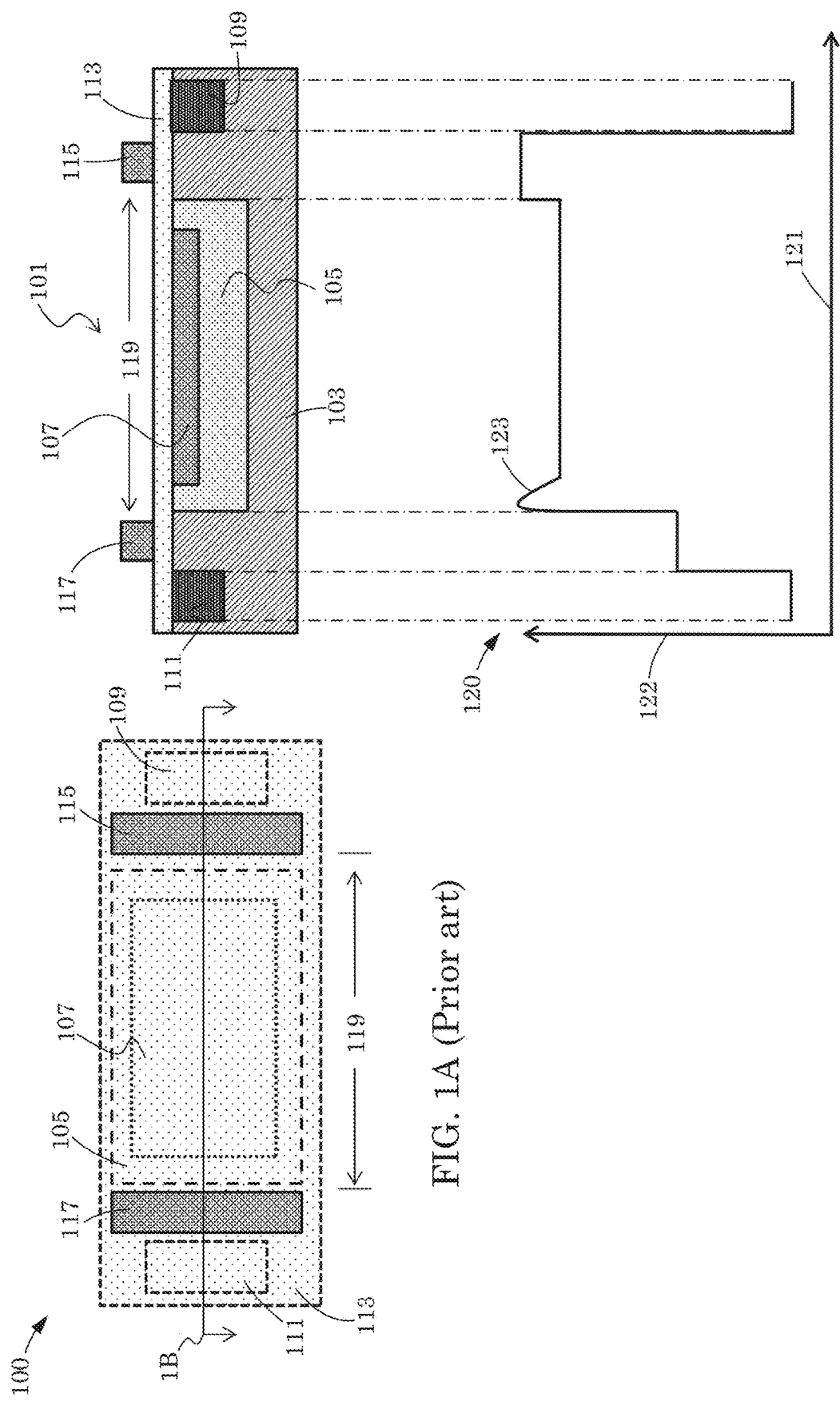
FIG. 1A depicts a schematic top view of an example semiconductor device.
FIG. 1B depicts a schematic cross-sectional view and a potential distribution spanning a lateral dimension of the example semiconductor device depicted in FIG. 1A.

FIG. 1A depicts a schematic top view of an example semiconductor device (e.g., a pixel). The semiconductor device 100 includes a pinned photodiode structure 101. The pinned photodiode structure 101 includes a substrate 103 of a first type (e.g., a p-type material), an implant layer 105 of a second type (e.g., an n-type material), and an implant layer 107 of the first type.

The semiconductor device 100 further includes a first floating diffusion implant layer 109 of a second type and a second floating diffusion implant layer 111 of a second type. The floating diffusion layers can be floating diffusion nodes or sense nodes, for example.

The semiconductor device 100 further includes an insulator layer 113 deposited on the substrate 103, a first transfer gate 115 (i.e., a component of an insulated gate structure), and a second transfer gate 117 (i.e., a component of another insulated gate structure), and a photo-detection region 119. The photo-detection region 119 is a photo-sensitive region within the semiconductor device 100 wherein incident electromagnetic radiation (e.g., ultraviolet, infrared, visible light) produces photo-generated charge-carriers. In some implementations, the photo-detection region 119 includes a region of charge-carrier depletion (e.g., a region of intrinsic charge-carrier concentration).

The insulator layer 113 can be substantially electrically insulating and substantially transparent to wavelengths of electromagnetic radiation such as electromagnetic radiation having wavelengths in the visible and/or invisible ranges (e.g., near infrared or infrared light). The insulator layer 113 can be composed, at least in part, of a substantially electrically insulating and transparent material (e.g., silicon dioxide or polycrystalline silicon dioxide). The insulator layer 113 insulates electrically the first transfer gate 115 and the second transfer gate 117 from the substrate 103.

The substrate 103, the implant layer 105 of the second type, the implant layer 107 of the first type, the first floating diffusion implant layer 109 of the second type, and the second floating diffusion implant layer 111 of the second type can each be composed, at least in part, of a semiconductor material, such as silicon, polycrystalline silicon, germanium, indium gallium arsenide, lead sulfide, and/or indium phosphide, and can further include donor and/or acceptor dopants. In some instances, the implant layer 105 of the second type, the implant layer 107 of the first type, the first floating diffusion implant layer 109 of the second type, and the second floating diffusion implant layer 111 of the second type can each be the same material as the substrate 103 though, in some cases, can have a different dopant concentration or spatial distribution.

In some instances, the majority charge-carriers within the components of the first type can be holes and the majority charge-carriers within the components of the second type can be electrons. In some cases, the majority charge-carriers within components of the first type can be electrons and the majority charge-carriers within the components of the second type can be holes. In either case, the majority charge carriers can occur intrinsically or can be introduced via acceptor (p-type) or donor (n-type) doping.

The first transfer gate 115 and second transfer gate 117 can be composed, at least in part, of substantially transparent material (e.g., polycrystalline silicon). Voltages can be applied to the first transfer gate 115 and the second transfer gate 117. In some cases, the voltages can be the same, while in some cases the voltages can be different. Accordingly, the first transfer gate 115 and the second transfer gate 117 can be operable to generate an electric drift field in the semiconductor device 100 (e.g., a fringe-field effect). In some implementations, the insulator layer 113 can have a thickness sufficient to enable the capacitive coupling between the substrate 103 and the first transfer gate 115 and second transfer gate 117 such that the voltage levels on the first and second transfer gates 115, 117, respectively, are reflected within the substrate 103 (i.e., reflected as potential distribution 120). In some implementations where different voltage levels are applied to the first transfer gate 115 and the second transfer gate 117, respectively, an electric drift field can arise within the semiconductor device 100 (e.g., laterally within the photo-detection region 119). An electric drift field within the semiconductor device 100 (i.e., a potential distribution) can facilitate the conduction of photo-generated charge carries (i.e., generated within the photo-detection region 119) to either the first floating diffusion implant layer 109 or the second floating diffusion implant layer 111. Such a potential distribution as described above is illustrated in FIG. 1B.

FIG. 1B depicts a schematic cross-sectional view and the potential distribution 120 spanning a lateral dimension of the semiconductor device depicted in FIG. 1A. The potential distribution 120 spanning a lateral dimension 121 of the semiconductor device 100 (i.e., along the line 1B) is depicted in a schematic plot with the lateral dimension 121 on the x-axis and potential 122 on the y-axis. As described above, the voltage levels on the first transfer gate 115 and the second transfer gate 117 are operable to generate a potential distribution 120 with particular characteristics intended to effect photo-generated charge-carriers. For example, the potential distribution 120 depicted in FIG. 1B can conduct photo-generated charge-carriers created within the photo-detection region 119 to the second floating diffusion implant layer 111 and can inhibit charge-carriers from being conducting into the first floating diffusion implant layer 109.

In some instances, voltage levels on the first transfer gate 115 and the second transfer gate 117 can be modulated such that the semiconductor device 100 can be operable to collect modulated electromagnetic radiation (e.g., intensity modulated electromagnetic radiation) incident on the photo-detection region 119 of the semiconductor device 100. Applications employing modulated electromagnetic radiation generate charge carriers with modulation characteristics of the incident modulated electromagnetic radiation. In such applications, for example, in time-of-flight applications, the charge-carriers with the modulation characteristics must necessarily be sampled at different instances in time. Accordingly, charge-carriers with the modulation characteristics are conducted through (at least partially through) the photo-detection region 119 via a potential distribution 120 (e.g., described above) and into respective first and second floating diffusion implant layers 109, 111 at different instances in time. The process can be repeated over multiple instances in time, such that each first and second floating diffusion layer is occupied with sufficient charge carriers. The charge-carriers in each first and second floating diffusion layer can be sampled and can be used to determine useful information (e.g., distance data).

The spatial position, concentration, spatial distribution, and purity of dopants within components of the semiconductor device 100 can significantly affect charge transport. For example, dopants can be accidentally introduced into the implant layer 105 of the second type and/or the implant layer 107 of the first type via mask misalignment (during ion implantation). The introduced dopant can generate a potential barrier 123, as depicted in FIG. 1B, and transport efficiency between the photo-detection region 119 and the first transfer gate 115 and/or second transfer gate 117 can be degraded significantly.

FIG. 2A depicts a schematic top view of an example semiconductor device 200 (e.g., a demodulation pixel) operable to overcome the limitations described above, such as mask misalignment during ion implantation. The semiconductor device 200 includes a pinned photodiode structure 201. The pinned photodiode structure 201 includes a substrate 203 of a first type, an implant layer 205 of a second type and an implant layer 207 of the first type. The semiconductor device further includes a first auxiliary implant layer 206 of the second type and a second auxiliary implant layer 208 of the second type.

The semiconductor device 200 further includes a first floating diffusion implant layer 209 of the second type and a second floating diffusion implant layer 211 of the second type. The floating diffusion implant layers 209, 211 can be floating diffusion nodes or sense nodes, for example. The semiconductor device 200 further includes an insulator layer 213 deposited on the substrate 203, a first transfer gate 215, and a second transfer gate 217, and a photo-detection region 219. Each gate (i.e., the first transfer gate 215 and the second transfer gate 217) can be a component of an insulated gate structure. The photo-detection region 219 is a photo-sensitive region within the semiconductor device 200 wherein incident electromagnetic radiation (e.g., ultraviolet, infrared, visible light) produces photo-generated charge-carriers. In some implementations, the photo-detection region 219 includes a region of charge-carrier depletion (e.g., a region of intrinsic charge-carrier concentration).

The insulator layer 213 can be composed of a substantially electrically insulating and transparent material (e.g., silicon dioxide or polycrystalline silicon dioxide). The insulator layer 213 insulates electrically the first transfer gate 215 and the second transfer gate 217 from the substrate 203. The first transfer gate 215 and the second transfer gate 217 can be composed, at least in part, of substantially transparent material (e.g., polycrystalline silicon).

The substrate 203, the implant layer 205 of the second type, the implant layer 207 of the first type, the first floating diffusion implant layer 209 of the second type, the second floating diffusion implant layer 211 of the second type, the first auxiliary implant layer of the second type 206, the second auxiliary implant layer 208 of the second type, can each be composed, at least in part, of a semiconductor material, such as silicon, polycrystalline silicon, germanium, indium gallium arsenide, lead sulfide, and/or indium phosphide, and can further include donor and/or acceptor dopants. In some instances, the implant layer 205 of the second type, the implant layer 207 of the first type, the first floating diffusion implant layer 209 of the second type, the second floating diffusion implant layer 211 of the second type, the first auxiliary implant layer of the second type 206, and the second auxiliary implant layer 208 of the second type can each be the same material as the substrate 203 though, in some cases, can have a different dopant concentration or spatial distribution. In some cases, the doping concentrations of the first auxiliary implant layer 206 of the second type and the second auxiliary implant layer 208 of the second type can be the same as the doping concentration as the implant layer 205 of the second type. In some instances, the first auxiliary implant layer 206 of the second type and the second auxiliary implant layer 208 of the second type could include a concentration gradient of dopants (e.g., the dopant concertation could vary linearly with thickness or some other dimension).

In some instances, the majority charge-carriers within the components of the first type can be holes and the majority charge-carriers within the components of the second type can be electrons. In some cases, the majority charge-carriers within components of the first type can be electrons and the majority charge-carriers within the components of the second type can be holes. In either case, the majority charge carriers can occur intrinsically or can be introduced via acceptor (p-type) or donor (n-type) doping.

Voltages can be applied to the first transfer gate 215 and the second transfer gate 217. In some cases, the voltages can be the same, while in some cases the voltages can be different. Accordingly, the first transfer gate 215 and the second transfer gate 217 can be operable to generate an electric drift field in the semiconductor device 200 (e.g., a fringe-field effect). In some implementations, the insulator layer 213 can have a thickness sufficient to enable the capacitive coupling between the substrate 203 and the first transfer gate 215 and second transfer gate 217 such that the voltage levels on the first and second transfer gates 215, 217, respectively, are reflected within the substrate 203 (i.e., reflected as potential distribution 220). In some implementations where different voltage levels are applied to the first transfer gate 215 and the second transfer gate 217, respectively, an electric drift field can arise within the semiconductor device 200 (e.g., laterally within the photo-detection region 219). An electric drift field within the semiconductor device 200 (i.e., a potential distribution) can facilitate the conduction of photo-generated charge carries (i.e., generated within the photo-detection region 219) to the first floating diffusion implant layer 209 via the first auxiliary implant layer 206 or the second floating diffusion implant layer 211 via the second auxiliary implant layer 208. In some instances, a dopant concentration gradient through the first auxiliary implant layer 206 and second auxiliary implant layer 208 can inhibit the formation of potential barriers caused by mask misalignment during ion implantation. Such a potential distribution as described above is illustrated in FIG. 2B.

FIG. 2B depicts a schematic cross-sectional view and a potential distribution 220 spanning a lateral dimension of the semiconductor device 200 depicted in FIG. 2A. The potential distribution 220 spanning a lateral dimension 221 of the semiconductor device 200 (i.e., along the line 2B) is depicted in a schematic plot with the lateral dimension 221 on the x-axis and potential 222 on the y-axis. As described above, the voltage levels on the first transfer gate 215 and the second transfer gate 217 are operable to generate a potential distribution 220 with particular characteristics. For example, the potential distribution 220 depicted in FIG. 2B can conduct charges generated within the photo-detection region 219 to the second floating diffusion implant layer 211 via the second floating diffusion implant layer 211 and can inhibit charge carriers from being conducted into the first floating diffusion implant layer 209.

Multiple configurations of the semiconductor device components are possible and are within the scope of this disclosure. In some instances, the implant layer 207 of the first type can extend under the first transfer gate 215 and/or the second transfer gate 217. In some instances, the first auxiliary implant layer 206 of the second type can extend under the first transfer gate 215. In some instances, the second auxiliary implant layer 208 of the second type can extend under the second transfer gate 217. In some instance, the first auxiliary implant layer 206 of the second type can abut the first floating diffusion layer 209. In some instances, the second auxiliary implant layer 208 of the second type can abut the second floating diffusion layer 211. Other configuration are within the scope of this disclosure; for example, at least one additional transfer gate, at least one additional auxiliary implant layer, and at least one additional floating diffusion layer can be includes in some implementations.

In some instances, voltage levels on the first transfer gate 215 and the second transfer gate 217 can be modulated such that the semiconductor device 200 can be operable to collect modulated electromagnetic radiation (e.g., intensity modulated electromagnetic radiation) incident on the photo-detection region 219 of the semiconductor device 200. Applications employing modulated electromagnetic radiation generate charge carriers with modulation characteristics of the incident modulated electromagnetic radiation. In such applications, for example, in time-of-flight applications, the charge-carriers with the modulation characteristics must necessarily be sampled at different instances in time. Accordingly, charge-carriers with the modulation characteristics are conducted through (at least partially through) the photo-detection region 219 via a potential distribution 220 (e.g., described above) and into respective first and second floating diffusion implant layers 209, 211 (via the first auxiliary implant layer 206 of the second type and a second auxiliary implant layer 208 of the second type) at different instances in time. The process can be repeated over multiple instances in time, such that each first and second floating diffusion layer 209, 211 is occupied with sufficient charge carriers. The charge-carriers in each first and second floating diffusion layer 209, 211 can be sampled and can be used to determine useful information (e.g., distance data).

Figure 3:
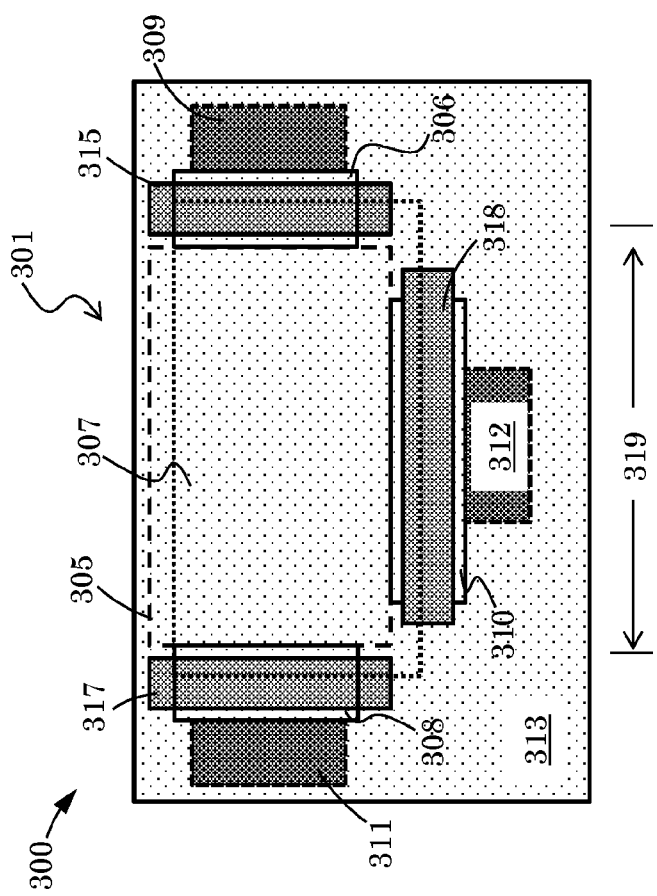
FIG. 3 depicts a schematic top view of yet another example semiconductor device.

FIG. 3 depicts a schematic top view of another example semiconductor device 300 (e.g., a demodulation pixel) operable to overcome the limitations described above, such as mask misalignment during ion implantation. The semiconductor device 300 includes a pinned photodiode structure 301. The pinned photodiode structure 301 includes a substrate 303 of a first type, an implant layer 305 of a second type and an implant layer 307 of the first type. The semiconductor device further includes a first auxiliary implant layer 306 of the second type, a second auxiliary implant layer 308 of the second type, and a dump auxiliary implant layer 310 of a second type.

The semiconductor device 300 further includes a first floating diffusion implant layer 309 of the second type, a second floating diffusion implant layer 311 of the second type, and a dump floating diffusion implant layer 312 of the second type. The floating diffusion implant layers can be floating diffusion nodes or sense nodes, for example. The semiconductor device 300 further includes an insulator layer 313 deposited on the substrate 303, a first transfer gate 315, a second transfer gate 317, a dump gate 318, and a photo-detection region 319. Each gate (i.e., the first transfer gate 315, the second transfer gate 317, and the dump gate 318) can be a component of an insulated gate structure. The photo-detection region 319 is a photo-sensitive region within the semiconductor device 300 wherein incident electromagnetic radiation (e.g., ultraviolet, infrared, visible light) produces photo-generated charge-carriers. In some implementations, the photo-detection region 319 includes a region of charge-carrier depletion (e.g., a region of intrinsic charge-carrier concentration).

The insulator layer 313 can be composed of a substantially electrically insulating and transparent material (e.g., silicon dioxide or polycrystalline silicon dioxide). The insulator layer 313 insulates electrically the first transfer gate 315 and the second transfer gate 317 from the substrate 303. The first transfer gate 315, the second transfer gate 317, and the dump gate 318 can be composed, at least in part, of substantially transparent material (e.g., polycrystalline silicon).

The substrate 303, the implant layer 305 of the second type, the implant layer 307 of the first type, the first floating diffusion implant layer 309 of the second type, the second floating diffusion implant layer 311 of the second type, the first auxiliary implant layer of the second type 306, the second auxiliary implant layer 308 of the second type, the dump auxiliary implant layer 310 of the second type, and the dump floating diffusion implant layer 312 of the second type can each be composed, at least in part, of a semiconductor material, such as silicon, polycrystalline silicon, germanium, indium gallium arsenide, lead sulfide, and/or indium phosphide, and can further include donor and/or acceptor dopants. In some instances, the implant layer 305 of the second type, the implant layer 307 of the first type, the first floating diffusion implant layer 309 of the second type, the second floating diffusion implant layer 311 of the second type, the first auxiliary implant layer of the second type 306, the second auxiliary implant layer 308 of the second type, the dump auxiliary implant layer 310 of the second type, and the dump floating diffusion implant layer 312 of the second type can each be the same material as the substrate 303 though, in some cases, can have a different dopant concentration or spatial dopant distribution. In some cases, the doping concentrations of the first auxiliary implant layer 306 of the second type, the second auxiliary implant layer 308 of the second type, and the dump auxiliary implant layer 310 of the second type can be the same as the doping concentration as the implant layer 305 of the second type. In some instances, the first auxiliary implant layer 306 of the second type, the second auxiliary implant layer 308 of the second type, and the dump auxiliary implant layer 310 of the second type could include a concentration gradient of dopants (e.g., the dopant concertation could vary linearly with thickness or some other dimension).

In some instances, the majority charge-carriers within the components of the first type can be holes and the majority charge-carriers within the components of the second type can be electrons. In some cases, the majority charge-carriers within components of the first type can be electrons and the majority charge-carriers within the components of the second type can be holes. In either case, the majority charge carriers can occur intrinsically or can be introduced via acceptor (p-type) or donor (n-type) doping.

Voltages can be applied to the first transfer gate 315, the second transfer gate 317, and the dump gate 318. In some cases, the voltages can be the same, while in some cases the voltages can be different. Accordingly, the first transfer gate 315, the second transfer gate 317, and the dump gate 318 can be operable to generate an electric drift field in the semiconductor device 300 (e.g., a fringe-field effect). In some implementations, the insulator layer 313 can have a thickness sufficient to enable the capacitive coupling between the substrate 303 and the first transfer gate 315, the second transfer gate 317, and the dump gate 318 such that the voltage levels on the first and second transfer gates 315, 317, respectively, and the dump gate 318 are reflected within the substrate 303. In some implementations, where different voltage levels are applied to the first transfer gate 315, the second transfer gate 317, respectively, and the dump gate 318 an electric drift field can arise within the semiconductor device 300 (e.g., laterally within the photo-detection region 319). An electric drift field within the semiconductor device 300 (i.e., a potential distribution) can facilitate the conduction of photo-generated charge carries (i.e., generated within the photo-detection region 319) to the dump floating diffusion implant layer 312 via the dump auxiliary implant layer 310. Charge-carriers associated with background electromagnetic radiation, for example, can be conducted to the dump floating diffusion implant layer 312. In some instances, a dopant concentration gradient through the first auxiliary implant layer 306, the second auxiliary implant layer 308, and the dump auxiliary layer 310 can inhibit the formation of potential barriers caused by mask misalignment during ion implantation.

Multiple configurations of the components of semiconductor device 300 are possible and are within the scope of this disclosure. In some instances, the implant layer 307 of the first type can extend under the first transfer gate 315 and/or the second transfer gate 317 and/or the dump gate 318. In some instances, the first auxiliary implant layer 306 of the second type can extend under the first transfer gate 315. In some instances, the second auxiliary implant layer 308 of the second type can extend under the second transfer gate 317. In some instances, the dump auxiliary implant layer 310 can extend under the dump gate 318. In some instance, the first auxiliary implant layer 306 of the second type can abut the first floating diffusion layer 309. In some instances, the second auxiliary implant layer 308 of the second type can abut the second floating diffusion layer 311. In some instances, the dump auxiliary layer 310 can abut the dump floating diffusion implant layer 312. Other configurations are within the scope of this disclosure; for example, at least one additional transfer gate, at least one additional auxiliary implant layer, and at least one additional floating diffusion layer can be included in some implementations.

In some instances, voltage levels on the first transfer gate 315, the second transfer gate 317, and the dump gate 318 can be modulated such that the semiconductor device 300 can be operable to collect modulated electromagnetic radiation (e.g., intensity modulated electromagnetic radiation) incident on the photo-detection region 319 of the semiconductor device 300. Applications employing modulated electromagnetic radiation generate charge carriers with modulation characteristics of the incident modulated electromagnetic radiation. In such applications, for example, in time-of-flight applications, the charge-carriers with the modulation characteristics must necessarily be sampled at different instances in time. Accordingly, charge-carriers with the modulation characteristics can be conducted through (at least partially through) the photo-detection region 319 into respective first and second floating diffusion implant layers 309, 311 (via the first auxiliary implant layer 306 of the second type and a second auxiliary implant layer 308 of the second type) at different instances in time. Charge-carriers without modulation characteristics (e.g., charge-carriers associated with background electromagnetic radiation) can be electromagnetic radiation that is not modulated can be conducted to through (at least partially though) the photo-detection region 319 into the dump floating diffusion implant layer 312 via the dump auxiliary implant layer 310. The process can be repeated over multiple instances in time, such that each first and second floating diffusion layer 309, 311 are occupied with sufficient charge carriers and the charge-carriers without modulation characteristics (e.g., associated with background electromagnetic radiation) are essentially eliminated. Accordingly, the charge-carriers in each first and second floating diffusion layer 309, 311 can be sampled and can be used to determine useful information (e.g., distance data) without being compromised by charge-carries without modulation characteristics, such as background electromagnetic radiation.

Other modifications may be made to the foregoing implementations, and features described above in different implementations may be combined in the same implementation. Thus, other implementations are within the scope of the claims.

What is claimed, is:

1. A semiconductor device operable to demodulate incident modulated electromagnetic radiation, the semiconductor device comprising:
   a pinned photodiode structure including a substrate of a first type, an implant layer of a second type disposed within the substrate;
   a first auxiliary implant layer of the second type disposed within the substrate and disposed adjacent to the implant layer of the second type;
   a second auxiliary implant layer of the second type disposed within the substrate and disposed adjacent the implant layer of the second type;
   an implant layer of the first type disposed over and extending beyond the implant layer of the second type and protruding parts of the implant layer of the first type extending into the first auxiliary implant layer of the second type and the second auxiliary implant layer of the second type;
   an insulator disposed on an upper surface of the substrate;
   a photo-detection region;
   a first transfer gate and a second transfer gate disposed on a surface of the insulator, the first transfer gate and the second transfer gate being operable to generate a field within the substrate of the first type; and
   a first floating diffusion implant layer of the second type and a second floating diffusion implant layer of the second type disposed within the substrate of the first type;
   wherein the first and second auxiliary implant layers of the second type have a concentration gradient of dopants varying linearly in a direction perpendicular to the upper surface of the substrate of the first type of the semiconductor device.

2. The semiconductor device of claim 1, the semiconductor device being operable to generate charge-carriers of the second type from modulated electromagnetic radiation incident on the photo-detection region, wherein the generated charge-carriers have modulation characteristics of the incident modulated electromagnetic radiation.

3. The semiconductor device of claim 2, wherein the first transfer gate and the second transfer gate are operable to conduct alternately charge-carriers to the first floating diffusion implant layer and to conduct charge-carriers to the second floating diffusion implant layer.

4. The semiconductor device of claim 1, the first auxiliary implant layer of the second type extending under the first transfer gate, and the second auxiliary implant layer of the second type extending under the second transfer gate.

5. The semiconductor device of claim 1, wherein the first auxiliary implant layer of the second type abuts the first floating diffusion implant layer of the second type.

6. The semiconductor device of claim 5, wherein the second auxiliary implant layer of the second type abuts the second floating diffusion implant layer of the second type.

7. The semiconductor device of claim 1, the first and second auxiliary implant layers of the second type being contiguous to the implant layer of the second type.

8. The semiconductor device of claim 1, wherein the majority charge-carriers in components of the first type are holes, and the majority charge-carriers in components of the second type are electrons.

9. The semiconductor device of claim 1, wherein the majority charge-carriers in components of the first type are electrons, and the majority charge-carriers in components of the second type are holes.

10. The semiconductor device of claim 1 further including at least one additional transfer gate disposed on a surface of the insulator, the at least one additional transfer gate being operable to generate a field within the substrate of the first type.

11. The semiconductor device of claim 10 further including at least one additional floating diffusion implant layer of the second type disposed within the substrate of the first type and at least one additional auxiliary implant layer of the second type disposed adjacent to the implant layer of the second type.

12. The semiconductor device of claim 11, the semiconductor device being operable to generate charge-carriers of the second type from modulated electromagnetic radiation incident on the photo-detection region, wherein the generated charge-carriers have modulation characteristics of the incident modulated electromagnetic radiation.

13. The semiconductor device of claim 12, wherein the first transfer gate, second transfer gate, and the at least one addition transfer gate are operable to conduct alternately charge-carriers to the first floating diffusion implant layer, to the second floating diffusion implant layer, and to the at least one additional floating diffusion implant layer.

14. The semiconductor device of claim 1, the semiconductor device being operable to generate charge-carriers of the second type from electromagnetic radiation incident on the photo-detection region.

15. The semiconductor device of claim 14 further including at least one dump gate disposed on a surface of the insulator, the at least one dump gate being operable to generate a field within the substrate of the first type; at least one dump floating diffusion implant layer of the second type disposed within the substrate of the first type; and at least one additional dump auxiliary implant layer of the second type disposed adjacent to the implant layer of the second type.

16. The semiconductor device of claim 15, wherein the first transfer gate, the second transfer gate, and the dump gate are operable to conduct charge-carriers to the at least one dump floating diffusion layer.

17. The semiconductor device of claim 16, wherein the first transfer gate, the second transfer gate, and the dump gate are operable to conduct alternately charge-carriers to the first floating diffusion implant layer, to the second floating diffusion implant layer, and to the dump floating diffusion implant layer.

18. The semiconductor device of claim 15, the first auxiliary implant layer of the second type extending under the first transfer gate, the second auxiliary implant layer of the second type extending under the second transfer gate, the dump auxiliary implant layer of the second type extending under the dump gate, and the first auxiliary implant layer, the second auxiliary implant layer, and the dump auxiliary implant layer each having a concentration gradient of dopants.

* * * * *